(12) United States Patent
Hill et al.

(10) Patent No.: US 12,040,217 B2
(45) Date of Patent: *Jul. 16, 2024

(54) SUBSTRATE LIFT MECHANISM AND REACTOR INCLUDING SAME

(71) Applicant: ASM IP Holding B.V., Almere (NL)

(72) Inventors: Eric Hill, Goodyear, AZ (US); John DiSanto, Scottsdale, AZ (US)

(73) Assignee: ASM IP Holding B.V., Almere (NL)

(*) Notice: Subject to any disclaimer, the term of this patent is extended or adjusted under 35 U.S.C. 154(b) by 75 days.

This patent is subject to a terminal disclaimer.

(21) Appl. No.: 18/100,660

(22) Filed: Jan. 24, 2023

(65) Prior Publication Data

US 2023/0163019 A1    May 25, 2023

Related U.S. Application Data

(60) Continuation of application No. 16/944,271, filed on Jul. 31, 2020, now Pat. No. 11,587,821, which is a
(Continued)

(51) Int. Cl.
| | |
|---|---|
| *H01L 21/687* | (2006.01) |
| *C23C 16/458* | (2006.01) |
| *C30B 25/08* | (2006.01) |
| *C30B 25/12* | (2006.01) |
| *H01L 21/67* | (2006.01) |

(52) U.S. Cl.
CPC .... *H01L 21/68742* (2013.01); *C23C 16/4581* (2013.01); *C23C 16/4584* (2013.01); *C23C 16/4586* (2013.01); *C30B 25/08* (2013.01); *C30B 25/12* (2013.01); *H01L 21/67028* (2013.01); *H01L 21/67069* (2013.01); *H01L 21/67248* (2013.01); *H01L 21/68792* (2013.01); *H01L 21/67126* (2013.01); *H01L 21/68757* (2013.01)

(58) Field of Classification Search
CPC ......... H01L 21/68742; H01L 21/67028; H01L 21/67069; H01L 21/67248; H01L 21/68792; H01L 21/67126; H01L 21/68757; C23C 16/4581; C23C 16/4584; C23C 16/4586; C30B 25/08; C30B 25/12
USPC .................................................. 156/345.54
See application file for complete search history.

(56) References Cited

U.S. PATENT DOCUMENTS

| | | | | |
|---|---|---|---|---|
| 5,820,685 A | * | 10/1998 | Kurihara | H01L 21/68742 118/728 |
| 6,063,196 A | * | 5/2000 | Li | H01L 21/68 118/712 |

(Continued)

FOREIGN PATENT DOCUMENTS

| | | |
|---|---|---|
| JP | 2001010894 A | 1/2001 |
| JP | 2001110726 A | 4/2001 |

(Continued)

*Primary Examiner* — Charlee J. C. Bennett
(74) *Attorney, Agent, or Firm* — Snell & Wilmer L.L.P.

(57) ABSTRACT

A substrate support assembly suitable for use in a reactor including a common processing and substrate transfer region is disclosed. The substrate support assembly includes a susceptor and one or more lift pins that can be used to lower a substrate onto a surface of the susceptor and raise the substrate from the surface, to allow transfer of the substrate from the processing region, without raising or lowering the susceptor.

20 Claims, 5 Drawing Sheets

Related U.S. Application Data division of application No. 15/672,096, filed on Aug. 8, 2017, now Pat. No. 10,770,336.

(56) References Cited

U.S. PATENT DOCUMENTS

| | | | |
|---|---|---|---|
| 6,146,463 A * | 11/2000 | Yudovsky | H01L 21/68 118/728 |
| 6,190,113 B1 * | 2/2001 | Bui | H01L 21/68742 414/217 |
| 6,454,852 B2 | 9/2002 | Dietze et al. | |
| 6,497,767 B1 * | 12/2002 | Okase | H01L 21/68735 118/712 |
| 6,955,741 B2 * | 10/2005 | Yamagishi | H01L 21/68742 118/724 |
| 7,173,219 B2 | 2/2007 | Okajima et al. | |
| 7,241,346 B2 | 7/2007 | Hanamachi et al. | |
| 7,301,623 B1 | 11/2007 | Madsen et al. | |
| 7,393,417 B1 | 7/2008 | Maeda et al. | |
| 7,838,800 B2 | 11/2010 | Tsukamoto | |
| 8,888,087 B2 | 11/2014 | Okabe et al. | |
| 10,770,336 B2 * | 9/2020 | Hill | C30B 25/08 |
| 11,208,718 B2 * | 12/2021 | Sakurai | H01L 21/67115 |
| 2003/0015141 A1 * | 1/2003 | Takagi | H01L 21/68735 118/728 |
| 2003/0178145 A1 * | 9/2003 | Anderson | H01L 21/68735 118/728 |
| 2004/0026041 A1 * | 2/2004 | Yamagishi | H01L 21/68742 118/729 |
| 2004/0144323 A1 * | 7/2004 | Kai | C23C 16/45521 118/728 |
| 2005/0095776 A1 | 5/2005 | Usuami | |
| 2006/0237421 A1 | 10/2006 | Lee et al. | |
| 2007/0144437 A1 | 6/2007 | Tateishi | |
| 2013/0025538 A1 * | 1/2013 | Collins | H01L 21/67115 118/712 |
| 2014/0007808 A1 * | 1/2014 | Okabe | H01L 21/68742 118/500 |
| 2014/0216657 A1 | 8/2014 | Kusumoto et al. | |
| 2014/0290573 A1 * | 10/2014 | Okabe | C23C 16/4585 118/500 |
| 2015/0132863 A1 | 5/2015 | Oohashi | |
| 2018/0135172 A1 * | 5/2018 | Nogami | C23C 16/4586 |

FOREIGN PATENT DOCUMENTS

| | | |
|---|---|---|
| JP | 2003133402 A | 5/2003 |
| JP | 2008235830 A | 10/2008 |
| JP | 2013138164 A | 7/2013 |
| KR | 20020011793 A | 2/2002 |
| KR | 20050121913 A | 12/2005 |
| KR | 20090018446 A | 2/2009 |
| KR | 101164129 B1 | 7/2012 |
| WO | 1995023428 A2 | 8/1995 |
| WO | 2008112673 A2 | 9/2008 |
| WO | 2017130809 A1 | 8/2017 |

* cited by examiner

SUBSTRATE LIFT MECHANISM AND REACTOR INCLUDING SAME

CROSS-REFERENCE TO RELATED APPLICATIONS

This application is a Continuation of, and claims priority to and the benefit of, U.S. patent application Ser. No. 16/944,271, filed Jul. 31, 2020 and entitled "SUBSTRATE LIFT MECHANISM AND REACTOR INCLUDING SAME," which is a Divisional of, and claims priority to and the benefit of, U.S. patent application Ser. No. 15/672,096, filed Aug. 8, 2017 and entitled "SUBSTRATE LIFT MECHANISM AND REACTOR INCLUDING SAME," which is hereby incorporated by reference herein.

FIELD OF INVENTION

The disclosure generally relates to apparatus for gas-phase processes. More particularly, exemplary embodiments of the present disclosure relate to a reactor including a common substrate transfer and processing region and to a substrate lift mechanism suitable for use therein.

BACKGROUND OF THE DISCLOSURE

Gas-phase reactors for processing substrates, such as semiconductor wafers, often include a susceptor within a reaction chamber. During processing, one or more substrates are placed within the reaction chamber and onto the susceptor using a robotic arm. After processing, the substrate(s) are removed from the surface of the susceptor and through an opening in the reaction chamber using the robotic arm.

Often, it is desirable to maintain a relatively small reaction space or region within the reaction chamber. The relatively small reaction space allows for more-efficient substrate processing. For example, a smaller amount of reactants can be used when processing substrates in a relatively small reaction space—compared to a larger reaction space and/or an amount of time to process substrates using the relatively small reaction space can be less than the amount of time to process substrates in the larger reaction space. To allow for a relatively small reaction space within a reaction chamber, while allowing placement of substrates onto the susceptor and removal of the substrates from the susceptor, a reaction chamber often includes a separate wafer transfer region that includes the opening within the reaction chamber to allow placement on and removal of the substrates from the susceptor.

During the substrate transfer process, lift pins, which extend through a vertical width of the susceptor and beyond, are sometimes used to facilitate placement and removal of the substrate on and from the surface of the susceptor. In such cases, a substrate can be placed onto the susceptor by placing (lowering) the susceptor to be within the substrate transfer region of the reaction chamber, causing the lift pins to rise above the surface of the susceptor, placing the substrate onto the lift pins, and lowering the lift pins, such that the substrate rests on the susceptor. The susceptor and the substrate can then be moved (raised) to a processing position, such that the substrate is within the reaction region of the reaction chamber.

Although such techniques work relatively well to place substrates within and remove substrates from a reaction space within the reactor, mechanisms to move the susceptor and the lift pins are relatively complex. In addition, reactors employing such techniques can exhibit undesired gas flow between the reaction region and the substrate transfer region—especially during substrate processing. The undesired gas flow can lead to deposition and/or corrosion of the reactor within the substrate transfer region. Furthermore, the volumes of such reactors are relatively large to accommodate both the processing/reaction region and the substrate transfer region of the reaction chamber. In addition, the multi-step process of moving the susceptor to a transfer region and moving the lift pins is a relatively time consuming. Accordingly, improved mechanisms and techniques for transferring and processing substrates are desired.

SUMMARY OF THE DISCLOSURE

Various embodiments of the present disclosure provide an improved method and apparatus for processing and transferring substrates. As set forth in more detail below, various systems and methods provide a reactor and/or use a method that can process substrates within a region and transfer substrates to/from the same region within a reactor. In other words, the reactor can include a reaction chamber including a common processing and transfer region. Accordingly, the overall reactor volume can be relatively small, the reactor can be less complex, more reliable, less expensive, and easier to maintain and/or process substrates in a reduced amount of time and/or in a less expensive manner.

In accordance with at least one exemplary embodiment of the disclosure, a reactor, which includes a common substrate processing and transfer region, includes a reaction chamber comprising a reaction region, a susceptor having a top surface within the reaction region, and a substrate lift mechanism. The substrate lift mechanism can include at least one lift pin, a lift pin support member that engages to (e.g., removably) couple to the at least one pin, and a movable shaft coupled to the lift pin support member. The substrate lift mechanism causes the at least one lift pin to extend above the susceptor surface. In accordance with various aspects of these embodiments, the moveable shaft moves in a vertical direction. The distance that the movable shaft and the lift pins move during a substrate transfer process can range from about 5 mm to about 25 mm, about 10 mm to about 20 mm, or be about 17 mm. In accordance with further aspects of these embodiments, the susceptor includes a center region and a peripheral region. A width of the center region can be greater than a width of the peripheral region. Such a design can facilitate forming the susceptor with a relatively small peripheral width, which in turn can facilitate use of the common region for both substrate processing and transfer. The reactor can further include a rotatable shaft and a susceptor support coupled to the rotatable shaft. The susceptor is coupled to the susceptor support, such that rotational movement of the rotatable shaft is translated to the susceptor. In accordance with various examples of these embodiments, an opening within the reaction chamber, to transfer substrates into and out of the reaction chamber, resides above a top surface of the susceptor when the susceptor is in a processing position.

In accordance with at least one other embodiment of the disclosure, a substrate support assembly includes a susceptor, a susceptor support coupled to the susceptor, a rotatable shaft coupled to the susceptor support, a lift pin support member, one or more lift pins coupled to the lift pin support member, a moveable shaft coupled to the lift pin support member, a lift pin mechanism to cause the moveable shaft to move in a vertical direction, and a susceptor rotation mechanism that causes the susceptor to rotate during substrate processing. The substrate support assembly can be configured, such that the susceptor does not move in a vertical direction during a substrate transfer process. In accordance with various aspects of these embodiments, the susceptor support includes a plurality of susceptor support arms and one or more susceptor support structures coupled to each susceptor support arm. The susceptor arm(s) can include an aperture to receive one of the one or more lift pins. The susceptor can be the same or similar to the susceptor described above and elsewhere in this specification.

In accordance with at least one further exemplary embodiment of the disclosure, a method of transferring and processing a substrate includes the steps of providing a reactor comprising a common region for substrate processing and substrate transfer, providing a substrate support assembly, such as the assembly described above and elsewhere in this specification, providing a substrate to the common region, moving the lift pins in a downward position to place the substrate in a processing position, processing the substrate, moving the lift pins in an upward position, and removing the substrate from the common region. The method can include removing the substrate from the common region through an opening that is located above a top surface of the susceptor—e.g., when the susceptor is in a processing position.

Both the foregoing summary and the following detailed description are exemplary and explanatory only and are not restrictive of the disclosure or the claimed invention.

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION OF EXEMPLARY EMBODIMENTS OF THE INVENTION

The description of exemplary embodiments of methods and apparatus provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

Any ranges indicated in this disclosure may include or exclude the endpoints. Additionally, any values of variables indicated (regardless of whether they are indicated with "about" or not) may refer to precise values or approximate values and include equivalents, and may refer to average, median, representative, majority, or the like.

Figure 1:
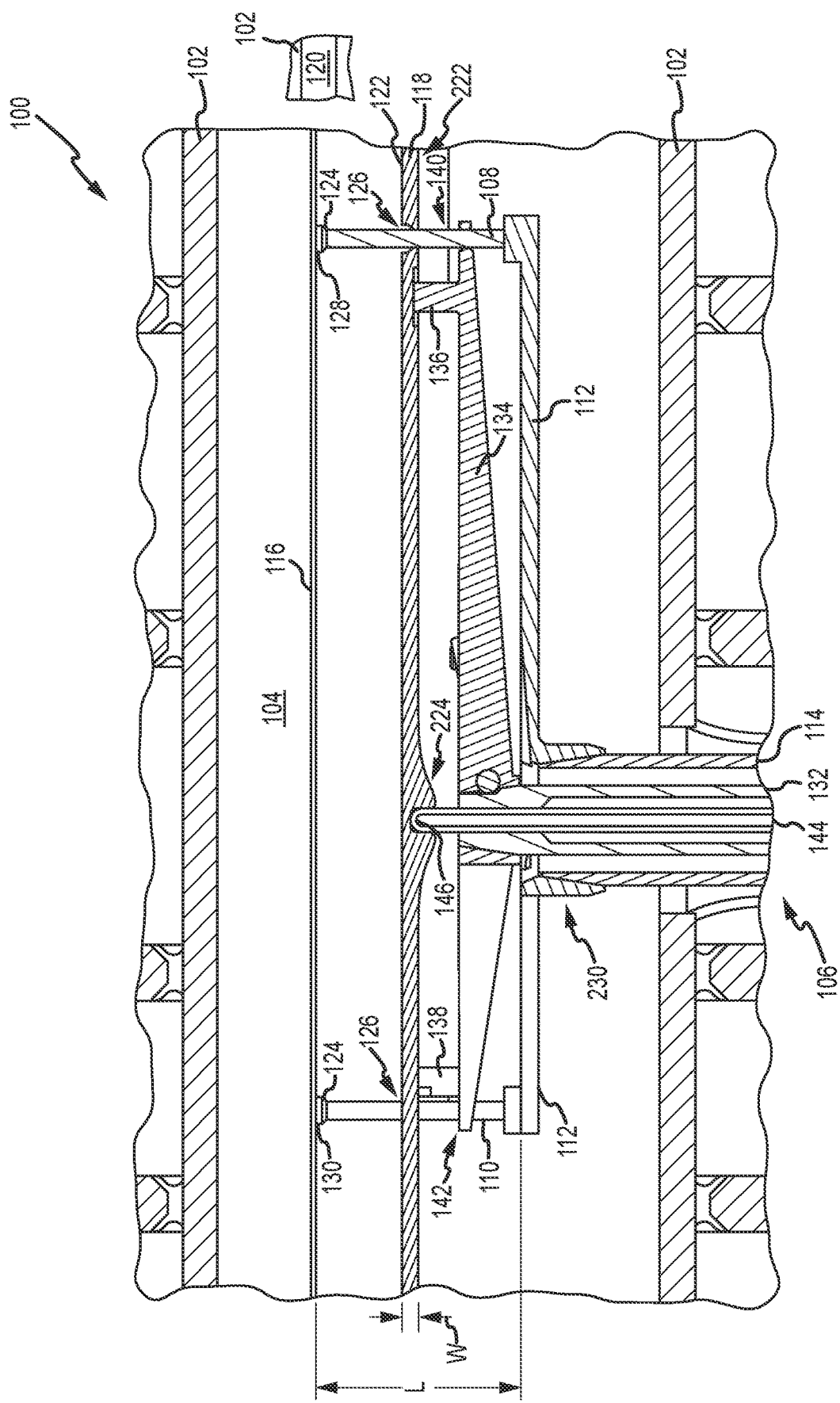
FIG. 1 illustrates a reactor in accordance with exemplary embodiments of the disclosure.

Turning now to FIG. 1, a reactor 100 in accordance with at least one embodiment of the disclosure is illustrated. Reactor 100 includes a reaction chamber 102 including a reaction region 104 and a substrate lift mechanism 106. As described in more detail below, during a substrate transfer operation, substrate lift mechanism 106 facilitates placement of a substrate 116 onto a top surface 122 of a susceptor 118 within reaction region 104 to allow removal of substrate 116 through an opening 120 of reaction chamber 102.

Reaction chamber 102 can be formed of, for example, quartz, and can be formed as a unitary piece, such as a tube. By way of example, reaction region 104 within reaction chamber 102 can have a rectangular cross section having a width of about 350 mm to about 450 mm (or be about ~420 mm), a length of about 400 mm to about 800 mm (or be about ~760 mm), and a height of about 20 mm to about 40 mm (or be about ~30 mm). As noted above, reaction chamber 102 includes an opening 120 that resides above top surface 122 of susceptor 118 (e.g., when surface 122 is in a processing position).

Reaction chamber 102 can be suitable for a variety of applications, such as film (e.g., epitaxial) deposition processes, etch processes, cleaning processing, and the like. Further, reactor 100 can be a standalone reactor or form part of a cluster tool that may include similar or different reaction chambers.

Substrate lift mechanism 106 includes at least one lift pin 108, 110, a lift pin support member 112 that can engage with and couple to the at least one pin 108, 110, and a movable shaft 114 mechanically coupled to the lift pin support member. During a substrate transfer process, substrate lift mechanism 106 causes the at least one lift pin 108, 110 to be raised or lowered to allow placement of substrate 116 onto surface 122 and/or removal of substrate 116 from surface 122.

Lift pins 108, 110 can be formed of any suitable material. For example, lift pins 108, 110 can be formed of silicon carbide (SiC), SiC-coated graphite, quartz, or glassy carbon. Although two lift pins 108, 110 are shown in FIG. 1, reactor 100 includes three (e.g., equally) spaced apart lift pins. Reactors in accordance with other embodiments of the disclosure can include any suitable number of lift pins and generally include three or more lift pins. A length L of lift pins 108, 110 can vary according to application. Generally a length of lift pins 108, 110 allows lift pins 108, 110 to extend through a width W of susceptor 118 and above the susceptor top surface 122—for example, when receiving a substrate 116 from a robotic arm (not illustrated) or presenting substrate 116 to be received by the robotic arm.

In accordance with some embodiments of the disclosure, lift pins 108, 110 have a length L of about 20 to about 40 mm or about 30 mm. This is a significantly shorter length than typical lift pins and allows processing and substrate transfer within a common region, namely reaction region 104. Lift pins 108, 110 can include a beveled section 124 that is received within a portion of susceptor 118. Beveled section 124 allows lift pins 108, 110 to be received within a via 126 within susceptor 118 and to be retained at a desired level (e.g., a top surface of lift pins can be about planar with surface 122 or reside just (e.g., a few mm or less) below surface 122. This allows susceptor 118 to retain lift pins 108, 110 when, for example, lift pin support member 112 is not engaged with lift pins 108, 110. A top surface 128, 130 of lift pins 108, 110 can have a diameter of about 3 to about 6 mm, or about 4 mm. Top surface 128, 130 can be polished to a smooth finish (e.g., a roughness average of about 0.05 to 0.2

μm or less) to prevent or mitigate surface damage to substrate 116 during a transfer process.

Lift pin support member 112 engages with lift pins 108, 110 and moveable shaft 114. In the illustrated example, lift pin support member 112 removably engages with lift pins 108, 110 and is coupled to moveable shaft 114. This allows movable shaft 114 to move only in a vertical direction (and not rotate), while allowing susceptor 118 to rotate—e.g., during substrate processing, as described in more detail below. Lift pin support member 112 can be formed of, for example, SiC-coated graphite, quartz, or glassy carbon.

Figure 2:
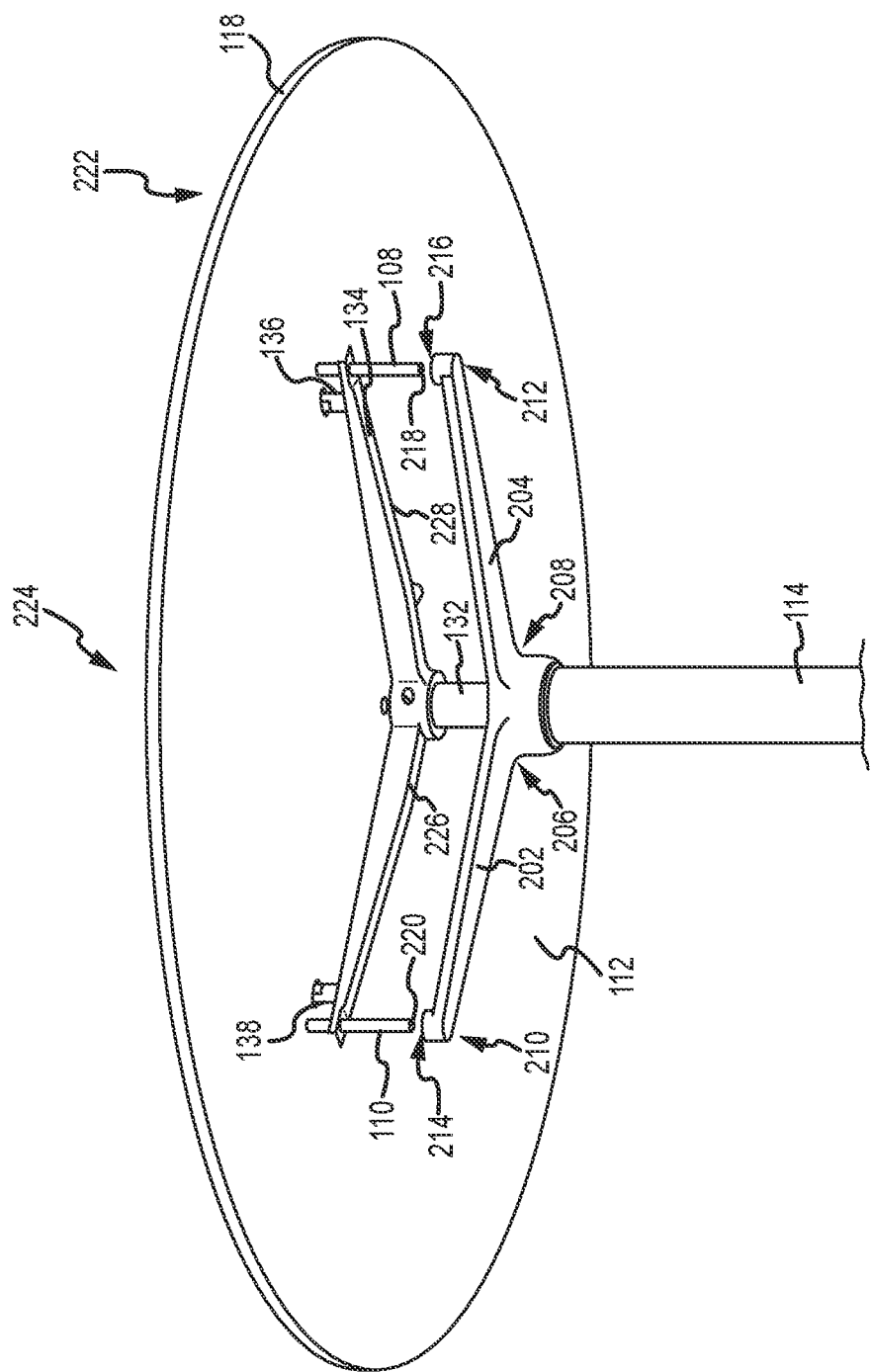
FIG. 2 illustrates components of a substrate support assembly in accordance with additional embodiments of the disclosure.

As illustrated in more detail in FIG. 2, lift pin support member 112 includes a plurality of lift pin arms 202, 204. Although two lift pin support arms are illustrated in FIG. 2, the illustrated lift pin support member includes three lift pin support arms. Each lift pin support arm 202, 204 includes a first end 206, 208 coupled moveable shaft 114 and a second end 210, 212 that receive and engage with a lift pin (e.g., one or lift pins 108, 110). Second end 210, 212 can include, for example, a recess 214, 216 to receive a bottom portion 218, 220 of one or lift pins 108, 110. Lift pin support member 112 can be a unitary member, as illustrated. Alternatively, lift pin support member can include a plurality of arms coupled to a coupling that is coupled to moveable shaft 114.

FIG. 1 illustrates lift pins 108, 110 when engaged with lift pin support member 112, such that lift pin support member 112 engages with lift pins 108, 110 and causes top surface 128, 130 of lift pins 108, 110 to reside above surface 122. FIG. 2 illustrates lift pin support member 112, when lift pin support member 112 is disengaged from lift pins 108, 110—i.e., when moveable shaft 114 is moved in a downward position relative to the position of moveable shaft 114 in FIG. 1. As illustrated in FIG. 2, when lift pin support member 112 is disengaged from lift pins 108, 110, lift pins 108, 110 are retained by susceptor 118, allowing susceptor 118 to rotate, without requiring support member 112 and/or moveable shaft 114 to rotate.

Moveable shaft 114 is in the form of a hollow tube. Moveable shaft 114 can be formed of, for example, quartz. In accordance with exemplary embodiments of the disclosure, moveable shaft is configured to move a vertical distance of 5 to about 25 mm (or ~17 mm). As a result, lift pins 108, 110 can move about 5 to about 25 mm (or ~17 mm), and lift pins 108, can extend to a height of up to about 5, 10, or 20 mm above surface 122.

Susceptor 118 can be formed of, for example, SiC or SiC-coated graphite. In accordance with various examples of the disclosure, width W of susceptor 118 is relatively small to allow lift pin-assisted substrate transfer and processing in a single region—e.g., reaction region 104. In accordance with various embodiments of the disclosure, a width W of susceptor 118 at a peripheral region 222 is less than a width of susceptor 118 at a center region 224 of susceptor 118. This configuration can allow from a relatively thin susceptor—especially at the peripheral region—while allowing susceptor to rotate and perform other functions, such as protecting an end of a thermocouple and providing desired heat transfer to and/or from substrate 116. By way of examples, the width at peripheral region 222 ranges from about 3 to about 6.5 mm (or ~3.8 mm). A width of center region 224 can range from about 6 to about 10 mm (or ~6.4 mm).

As noted above, reactor 100 can be configured to cause substrate 116 to rotate during substrate processing. In this illustrated example, reactor 100 includes a rotatable shaft 132 and a susceptor support 134 to cause susceptor 118, and consequently substrate 116, to rotate during processing. Rotatable shaft 132 can be formed of, for example, quartz. Rotatable shaft 132 can be configured to couple to susceptor support 134 to translate rotational movement of rotatable shaft 132 to susceptor support 134. By way of example, rotatable shaft 132 can be coupled to susceptor support 134 using a coupling 148.

As illustrated in FIGS. 1 and 2, susceptor support 134 includes one or more (e.g., a plurality of) susceptor support arms 226, 228 and structures 136, 138. Structures 136, 138 can engage with susceptor 118 and susceptor support arms 226, 228. Alternatively, structures 136, 138 can be integrally formed with susceptor support arms 226, 228. Susceptor support arms 226, 228 and structures 136, 138 can be formed of, for example, SiC, SiC-coated graphite, or quartz. Although illustrated with one structure 136, 138 for each susceptor support arms 226, 228, susceptor support 134 can include a plurality of structures 136, 138 for each susceptor support arm 226, 228. In accordance with exemplary embodiments of the disclosure, at least one of the plurality of susceptor support arms 226, 228 includes an aperture 140, 142 to receive a lift pin.

Reactor 100 can also include a thermocouple 144. Thermocouple 144 can be used to measure a temperature of susceptor 118—for example—during substrate processing. As illustrated in FIG. 1, thermocouple 144 can include an end 146, which extends through moveable shaft and rotatable shaft. End 146 can reside within center region 224 of susceptor 118. Center region 224 may provide additional radiation shielding for end 146 of thermocouple 144.

In accordance with further exemplary embodiments of the disclosure, a substrate support assembly 230 includes components to cause lift pins 108, 110 to raise and lower and to cause susceptor 118 to rotate. In accordance with these embodiments, substrate support assembly 230 includes susceptor 118, susceptor support 134, rotatable shaft 132, lift pin support member 112, one or more lift pins 108, 110, moveable shaft 114, a lift pin mechanism to cause the moveable shaft to move in a vertical direction during a substrate transfer process, and a susceptor rotation mechanism that causes susceptor 118 to rotate during substrate processing. As noted above, in accordance with various examples of the disclosure, susceptor 118 does not move in a vertical direction during substrate transfer—i.e., susceptor 118 does not move in a vertical direction as lift pins are raised and/or lowered and/or during other steps of a substrate transfer process. As described below, the lift pin mechanism and the susceptor rotation mechanism can be combined.

Figure 3:
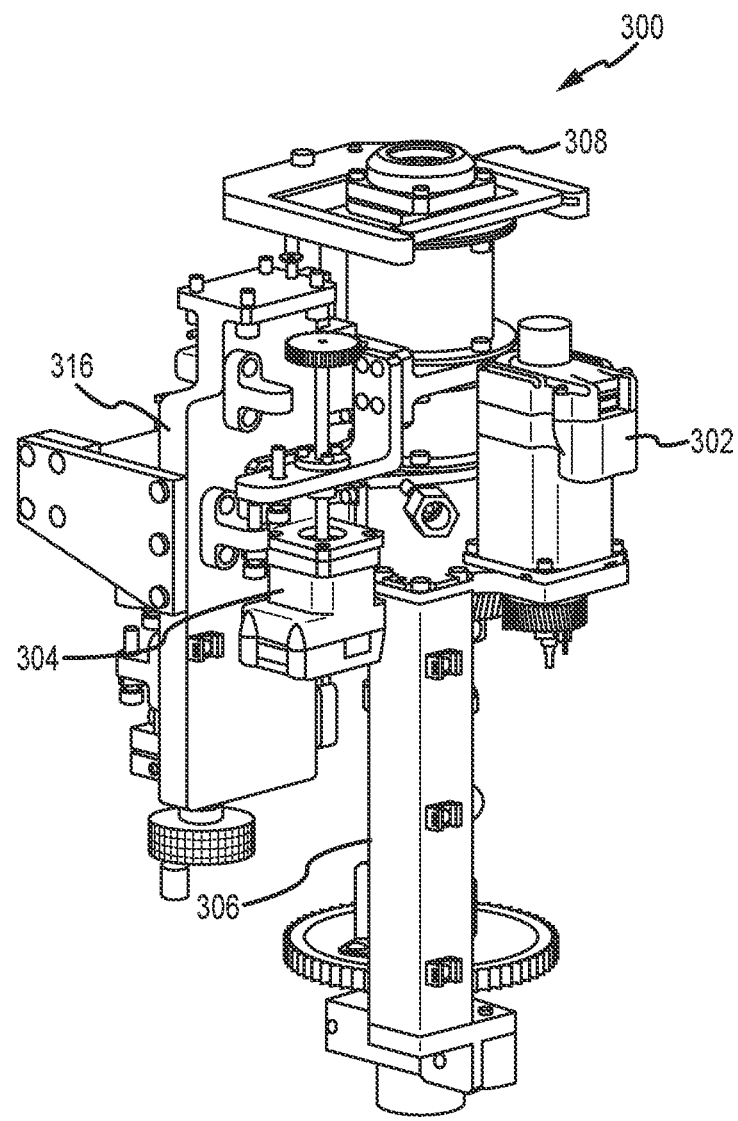
FIGS. 3-5 illustrate a lift/rotate mechanism in accordance with exemplary embodiments of the disclosure.
Figure 4:
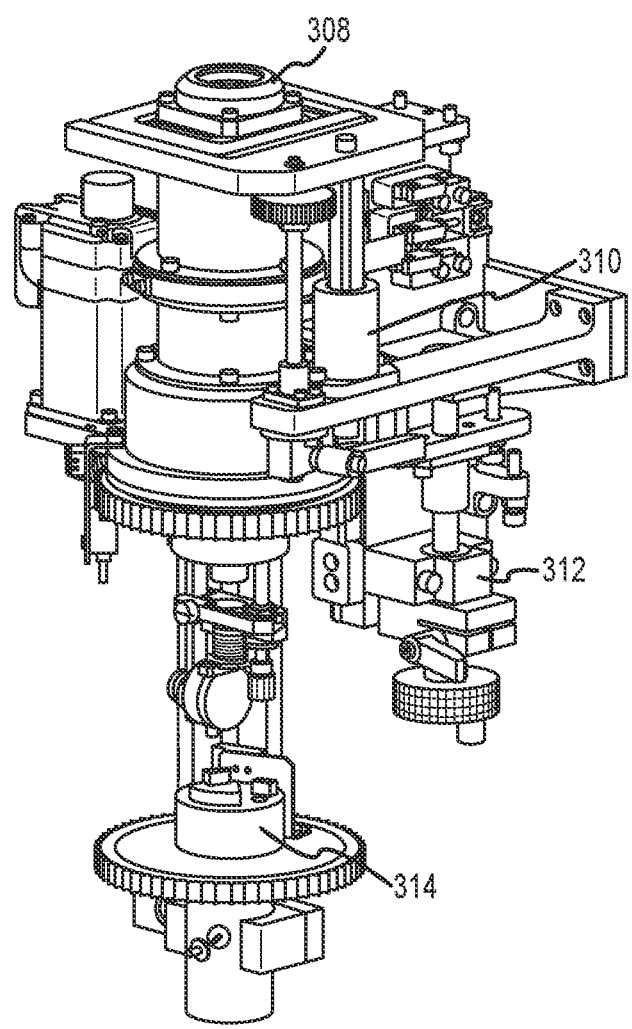
Figure 5:
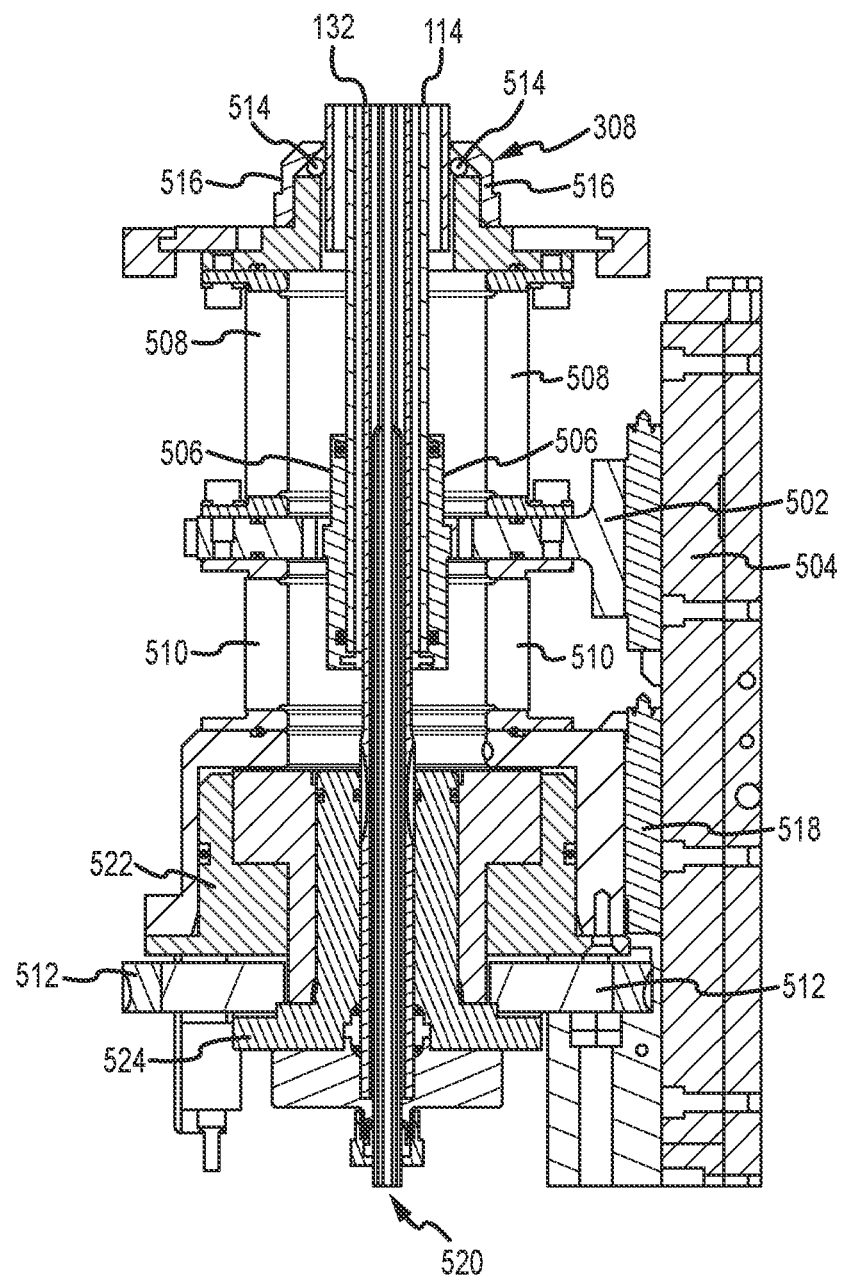

FIGS. 3-5 illustrate a lift/rotate mechanism 300 in accordance with exemplary embodiments of the disclosure. Lift/rotate mechanism 300 can be used to raise and lower lift pins (e.g., lift pins 108, 110) and to cause a susceptor (e.g., susceptor 118) to rotate. FIG. 3 illustrates a rear isometric view of lift/rotate mechanism 300, FIG. 4 illustrates a front isometric view of lift/rotate mechanism 300, and FIG. 5 illustrates a simplified cross-sectional-view of lift/rotate mechanism 300.

With reference to FIGS. 3 and 4, in the illustrated example, lift/rotate mechanism 300 includes a susceptor rotary actuator 302, a pin lift actuator 304, a rotary signal junction bracket, a tubulation seal 308, a tubulation seal support 310, a susceptor manual actuator 312, a thermocouple signal rotary junction 314, and a mounting bracket 316.

Susceptor rotary actuator 302 is used to provide rotational movement to a susceptor, such as susceptor 118. By way of example, susceptor rotary actuator 302 is configured to provide rotational movement to rotatable shaft 132 to cause susceptor 118 to rotate—e.g., during processing of a substrate—using rotational drive gear 512. Exemplary rotational speed can range from about 5 rpm to about 150 rpm, about 10 rpm to about 50 rpm, or be about 35 rpm.

Pin lift actuator 304 is configured to cause lift pins (e.g., lift pins 108, 110) to move in a vertical direction. By way of example, pin lift actuator 304 causes a pin lift carriage 502 to move vertically along a linear slide rail 504. Carriage 502 is mechanically coupled to moveable shaft 114 (e.g., using a pin lift shaft mounting sleeve 506) to cause lift pins (e.g., by way of lift pin support member 112) to move in a vertical direction. Pin lift shaft mounting sleeve 506 and moveable shaft 114 can be protected from the environment using an upper bellows 508 and a lower bellows 510.

Rotary signal junction box 306 can be used to facilitate provision of signals to and/or from susceptor rotary actuator 302, pin lift linear actuator 304, and/or one or more thermocouples, such as thermocouple 144.

Tubulation seal 308 and a tubulation seal support 310 are used to provide a seal about moveable shaft 114. As illustrated in FIG. 5, tubulation seal 308 can include a seal 514 and a support plate 516 to retain seal 514 as moveable shaft 114 moves relative to seal 308.

Although, in accordance with various embodiments of the disclosure, a susceptor does not move vertically during substrate processing, it may be desirable to move a susceptor for maintenance, installation, or the like. In such cases, susceptor manual actuator 312 can be used to manually move a susceptor (e.g., susceptor 118) in a vertical direction via a susceptor lift carriage 518.

In the illustrated example, lift/rotate mechanism 300 includes a relatively large feedthrough 520 (e.g., having a diameter of about 20 to about 50 mm or be about 34.5 mm), which allows installation of moveable shaft 114, through a rotary feedthrough 522 and a susceptor shaft mounting sleeve 524, from below. A configuration of lift/rotate mechanism 300 is relatively compact, compared to lift/rotate mechanism that cause a susceptor to move vertically during a substrate transfer process.

In accordance with additional embodiments of the disclosure, a method of transferring and processing a substrate is provided. The method can employ the reactor, substrate support assembly, and/or lift/rotate mechanism as described herein. An exemplary method includes the steps of providing a reactor comprising a common region for substrate processing and substrate transfer, providing a substrate support assembly, providing a substrate to the common region, moving the lift pins in a downward position to place the substrate in a processing position, processing the substrate, moving the lift pins in an upward position, and removing the substrate from the common region. The step of removing the substrate can include removing the substrate from the common region through an opening in a reaction or processing region that is above a top surface of the susceptor.

Although exemplary embodiments of the present disclosure are set forth herein, it should be appreciated that the disclosure is not so limited. For example, although the apparatus and methods are described in connection with various specific components, the disclosure is not necessarily limited to these configurations. Various modifications, variations, and enhancements of the apparatus and methods set forth herein can be made without departing from the spirit and scope of the present disclosure.

What is claimed is:

1. A reactor comprising a common substrate processing and transfer region, the reactor comprising:
   a reaction chamber comprising a reaction region;
   a susceptor having a susceptor top surface within the reaction region;
   a substrate lift mechanism comprising:
      at least one lift pin;
      a lift pin support member that removably engages to the at least one pin; and
      a movable shaft coupled to the lift pin support member,
   a rotatable shaft; and
   a susceptor support comprising one or more susceptor support arms and one or more susceptor support structures, the susceptor support coupled to the rotatable shaft,
   wherein the one or more susceptor support arms comprise an aperture to receive the at least one lift pin at a location radially exterior to a susceptor support structure of the one or more susceptor support structures.

2. The reactor of claim 1, wherein the moveable shaft traverses a distance of about 5 mm to about 25 mm during a substrate transfer process.

3. The reactor of claim 1, wherein the reaction chamber is formed of quartz.

4. The reactor of claim 1, wherein the reaction region comprises a rectangular cross section.

5. The reactor of claim 1, wherein a length of the at least one lift pin ranges from about 20 mm to about 40 mm.

6. The reactor of claim 1, wherein the at least one lift pin comprises a lift pin top surface, and wherein the substrate lift mechanism causes the lift pin top surface to extend from below the susceptor top surface to a distance up to about 22 mm above the susceptor top surface.

7. The reactor of claim 1, wherein the susceptor comprises a center region and a peripheral region and wherein a width of the center region is greater than a width of the peripheral region.

8. The reactor of claim 7, wherein the width of the peripheral region ranges from about 3 mm to about 6.5 mm.

9. The reactor of claim 7, wherein the width of the center region ranges from about 6 mm to about 10 mm.

10. The reactor of claim 7, wherein the reactor further comprises at least one thermocouple having an end, the at least one thermocouple extending through the moveable shaft, and the end received within an opening in the center region.

11. The reactor of claim 1, wherein the susceptor comprises graphite coated with silicon carbide.

12. The reactor of claim 1, wherein the susceptor is coupled to the susceptor support, such that a rotational movement of the rotatable shaft is translated to the susceptor.

13. The reactor of claim 12, wherein the susceptor support comprises a plurality of support structures.

14. The reactor of claim 13, wherein the-plurality of-susceptor support structures comprise SiC, SiC-coated graphite, or quartz.

15. A substrate support assembly comprising:
   a susceptor;
   a susceptor support coupled to the susceptor;
   a rotatable shaft coupled to the susceptor support;
   a lift pin support member;
   one or more lift pins coupled to the lift pin support member;
   a moveable shaft coupled to the lift pin support member;

a lift pin mechanism to cause the moveable shaft to move in a vertical direction during a substrate transfer process; and a susceptor rotation mechanism that causes the susceptor to rotate during substrate processing, wherein the susceptor support comprises a plurality of susceptor support arms and one or more susceptor support structures coupled to or integrated with each of the plurality of susceptor support arms, and wherein the susceptor retains at least one lift pin at a location radially exterior to a susceptor support structure of the one or more susceptor support structures.

16. The substrate support assembly of claim 15, wherein at least one of the plurality of susceptor support arms comprises an aperture to receive a lift pin at a location radially exterior to the susceptor support structure.

17. The substrate support assembly of claim 15, wherein the susceptor comprises a center region and a peripheral region and wherein a width of the center region is greater than a width of the peripheral region.

18. The substrate support assembly of claim 17, further comprising at least one thermocouple having an end, the at least one thermocouple extending through the moveable shaft, and the end received within an opening in the center region.

19. The substrate support assembly of claim 15, wherein the moveable shaft is formed of quartz.

20. The substrate support assembly of claim 15, wherein the susceptor is configured to rotate from about 5 rpm to about 150 rpm.

* * * * *